(12) United States Patent
Clements et al.

(10) Patent No.: US 6,690,576 B2
(45) Date of Patent: Feb. 10, 2004

(54) EXTERNALLY MOUNTED ON-LINE REPLACEABLE FAN MODULE

(75) Inventors: Bradley E Clements, Ft Collins, CO (US); Angela L Minichiello, Fort Collins, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 112 days.

(21) Appl. No.: 09/918,899

(22) Filed: Jul. 31, 2001

(65) Prior Publication Data

US 2003/0026074 A1 Feb. 6, 2003

(51) Int. Cl.⁷ .................................................. H05K 7/20
(52) U.S. Cl. ...................... 361/695; 312/236; 165/80.3; 361/678; 415/213.1
(58) Field of Search .......................... 417/360, 423.15; 312/236; 165/80.3, 121–126; 454/184; 415/118, 177, 178, 213.1, 214.1; 174/16.1; 439/61, 894; 361/678, 690, 692–695, 831

(56) References Cited

U.S. PATENT DOCUMENTS

| | | | | |
|---|---|---|---|---|
| 4,767,262 A | | 8/1988 | Simon ........................ 415/119 |
| 4,834,615 A | * | 5/1989 | Mauch et al. ............. 415/213.1 |
| 5,630,469 A | * | 5/1997 | Butterbaugh et al. ...... 165/80.3 |
| 5,880,932 A | | 3/1999 | Jelinger ...................... 361/695 |
| 5,886,639 A | | 3/1999 | Behl et al. .................... 340/635 |
| 5,999,403 A | | 12/1999 | Neustadt ..................... 361/695 |
| 6,000,623 A | | 12/1999 | Blatti et al. ................. 236/49.3 |
| 6,031,719 A | * | 2/2000 | Schmitt et al. ............. 361/695 |
| 6,075,698 A | | 6/2000 | Hogan et al. ............... 361/695 |
| 6,094,346 A | | 7/2000 | Schweers et al. ........... 361/695 |
| 6,104,608 A | | 8/2000 | Casinelli et al. ............ 361/692 |
| 6,185,097 B1 | | 2/2001 | Behl ........................... 361/695 |
| 6,213,819 B1 | | 4/2001 | Fan ............................. 439/894 |
| 6,236,564 B1 | | 5/2001 | Fan ............................. 361/695 |
| 6,375,440 B2 | * | 4/2002 | Kosugi ................... 417/423.14 |
| 6,406,257 B1 | * | 6/2002 | Houdek ................... 415/213.1 |
| 6,414,845 B2 | * | 7/2002 | Bonet ......................... 361/695 |

* cited by examiner

Primary Examiner—Gerald Tolin (57) ABSTRACT

A cooling fan apparatus includes a plastic housing and an electric fan. The housing containing the fan is mounted directly on the external surface of equipment being cooled. No separate mounting frame is utilized. The modular fan apparatus is on-line replaceable and is useful with other units to provide cooling fan redundancy. Preferably, a filtered electrical connector and a light emitting diode are integrated with the housing.

5 Claims, 6 Drawing Sheets

EXTERNALLY MOUNTED ON-LINE REPLACEABLE FAN MODULE

FIELD OF THE INVENTION

The invention is related to the field of machine cooling fans, and in particular, to a modular on-line replaceable cooling fan system for computer systems.

BACKGROUND OF THE INVENTION

Statement of the Problem

Electric fans are used extensively to cool electronic equipment, such as computers. This is important for efficient operation and prevention of damage to heat-sensitive electronic components. Various structures and systems are known for cooling computers. One known system, used in server applications, mounts individual fans internally of the housing. In these systems, the power circuit for each fan is connected to the power circuit of the computer to obtain the necessary working voltage. These internally-mounted fan systems are typically constructed with a light-emitting diode to indicate the operability status of each individual fan. A concern with these systems is that a failure of a fan requires the power circuit for the computer to be turned off for maintenance of the failed fan. Further, the diodes are placed internally of the server such that the status of the fans cannot be determined without removing the product housing.

A known solution for these problems is the use of externally mounted fans. Externally mounted fans typically require a separate mounting frame attached to the outside of a system cabinet and electromagnetic interference (EMI) gaskets to protect against unwanted EMI.

A concern with externally mounted fan systems is that the separate mounting frames and EMI gaskets reduce the airflow perforation area available for cooling. For example, U.S. Pat. No. 6,213,819 B1 ('819), and U.S. Pat. No. 6,236,564 B1 ('564) disclose a detachable fan rack for housing a fan having a separate mounting frame for the fans. For example, the mounting frames of the '819 and the '564 patents cover potential ventilation perforation area thereby blocking airflow. Further, for these externally mounted fan systems, electrical connection for each fan is either mounted directly to the carrier, or it is attached to the carrier via a cable assembly. Thus, the separate mounting frame and manipulation by a user of electrical connections complicate utilization of these fan systems, especially when redundancy and on-line replaceability are important.

Thus, a need exists for a fan cooling system that allows for on-line replacement of individual fan units and maximizes the ventilation area in the airflow pathway between the system component, such as a computer server, and the fan unit(s).

SUMMARY OF THE INVENTION

It is an object of the present invention to provide a fan cooling system for an electrical component, such as a server, that enables individual fan units to be detached without cutting off power supply for the server. It is a further object of the present invention to maximize use of the ventilation area for such a modular fan cooling system. It is yet another object of the present invention to provide an easily accessible indication of an individual fan units operability status.

The present invention helps to solve some of these problems by providing a fan cooling system having an array of fan units detachably mounted to a mounting surface of the component. A cooling fan units are provided for use with an electrical component presenting a cooling airflow to and from the enclosure of the electrical component. Each fan unit includes a fan assembly, a fan housing, and structure for mounting the unit to the component. An electric fan is provided having fan blades operable to create airflow by rotating in a path having an outer diameter. The fan housing is a box shaped housing presenting a square shaped open face and having a mutually opposed wall with openings to permit fan induced airflow through said housing and face openings. A square shaped fan wall structure is provided presenting a centrally located circular opening having a diameter outside of which are presented corner regions. The diameter of the circular opening of the wall structure is slightly greater than the outer diameter of the fan blades. The fan is affixed to the wall structure to form a fan assembly. The fan is positioned in axial alignment with the wall structure circular opening to permit fan induced airflow therethrough. The fan assembly is secured within the housing at a position that is recessed inwardly from the square shaped open face. The housing includes structure for releasably fastening the housing to the electrical component so that the open face of the housing abuts the fan mounting surface and encloses a region of airflow apertures thereon. A corner regional portion of said apertures is defined as those in longitudinal alignment with the corner regions of the fan assembly wall structure. The fan assembly induced airflow between the fan assembly and the corner region apertures of the component mounting structure is unrestricted by intervening structure, thus maximizing ventilation air flow.

Alternatively, a finger guard having an array air flow apertures may be positioned at the open face of the housing which also presents corner region apertures to improve airflow between the fan assembly and the corresponding corner region apertures located in the component mounting plate.

Each fan unit further includes an electrical connector integral with the housing for detachably connecting a fan unit with a power supply and a light emitting diode mounted to the housing for indicating operability of the fan. The electrical connector is configured to be mateably received with a connector formed in the component to provide power to the individual units.

Other advantages and components of the present invention will become apparent from the following description taken in conjunction with the accompanying drawings, which constitute a part of this specification and wherein are set forth exemplary embodiments of the present invention to illustrate various objects and features thereof.

DESCRIPTION OF THE INVENTION

The invention is described herein with reference to FIGS. 1–6. An externally mounted fan cooling system in accordance with the present invention is indicted generally at 10 in FIG. 5. The fan cooling system 10 comprises an array of fan units 100 that are individually and releasably mountable to a planar mounting surface 210 of a system component. Each fan unit 100 comprises a housing 102, a fan assembly 120, and structure for releasably mounting the fan unit indicated generally at the mounting surface 210.

Figure 2:
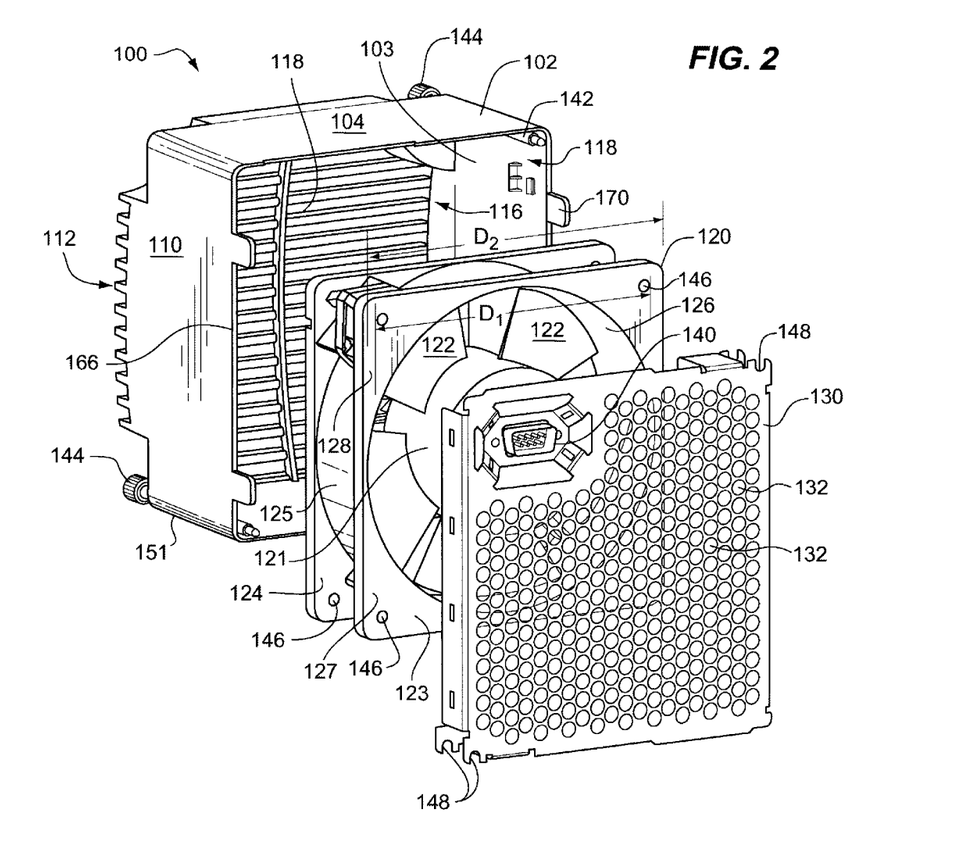
FIG. 2 shows an exploded rear perspective of the fan unit.
Figure 3:
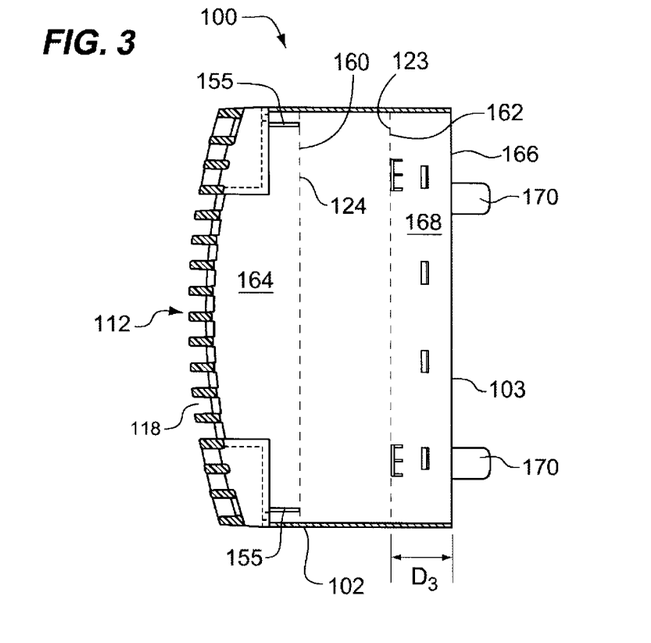
FIG. 3 depicts a side elevational view of the fan unit.

Referring to FIG. 2, fan assembly 120 includes an electric fan 121 having fan blades 122 that is operable to induce air flow by rotating in a path having outer diameter D1. A square shaped fan wall structure is provided as a pressure barrier between fan inlet and outlet (which varies depending on direction of airflow). In the preferred embodiment, the fan wall structure is in the form of walls 123, 124 connected by a cylindrical fan housing 125 that presents a centrally located circular opening 126 having a diameter D2 of about the outer diameter D1 of the fan blades. Fan 121 is affixed to the wall structure by conventional methods to form the fan assembly 120 and is in axial alignment with the wall structure circular opening 126 to permit fan induced airflow there through. Fan assembly 120 further presents corner regions, an example being corner regions 127, 128. The fan assembly 120 is affixed to and located within housing 102 at a position that is recessed inwardly a distance D3 from the square shaped open face 103, as shown in FIG. 3.

Figure 2A:
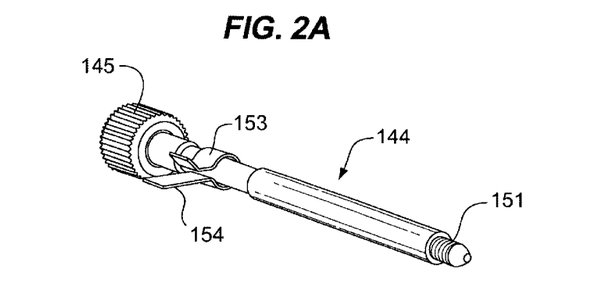
FIG. 2A depicts a perspective view of a mounting rod.

Housing 102 is a substantially box shaped enclosure presenting a square shaped open face 103. Housing 102 further includes a mutually opposed wall, which in the preferred embodiment is in the form of a front wall 112 presenting a convex face outwardly of the system component (as shown in FIG. 2A) that includes airflow openings 118.

The cooling system 10 in accordance with the invention typically is utilized as an exhaust fan, drawing air out of a computer or other instrument or machine. Therefore, fan 121 typically has an orientation such that fan blades 122 have their air-intake side 123 facing rear airflow opening 118. The air intake side of fan blades, however, may create an injury or damage risk. Thus, a rear-wall finger guard 130 may optionally be included and located at airflow opening 103. Rear-wall finger guard 130 typically is fabricated from sheet metal and has air flow openings 132 operably configured to minimize interference with air flow.

Each unit further includes an electrical connector 140 integral with housing 102 to facilitate on-line replaceability. Preferably, when a guard 130 is used, electrical connector 140 is located within guard 130 and is connected by wiring to electric fan 121. Electrical connector 140 is releasably mateable with power supply connector 212 mounting surface of the system component. When a guard 130 is not used, the electrical connector and power supply connector will have a design and location that will be dictated by design choice. The mounting surface is provided with an array of power supply connectors to receive the array of fan units.

In an external fan assembly, the electrical connection must extend through the electromagnetic compatability (EMC) enclosure. Thus, a filtered electrical connector is used to prevent electromagnetic waves from radiating outside of the chassis through the connector wiring. Any known filtered connector, such as a capacitor filter, a ferrite filter or a piezoelectric filter connector may be used.

Typically, the planar mounting surface 210 of the component is simply an external surface of a conventional machine cabinet wall or machine chassis. The mounting surface is formed with apertures, perforations or air channels through which cool air is pushed or heated air is withdrawn. An advantage of an apparatus in accordance with the invention is that it can be externally mounted directly onto the external surface of a machine housing wall or chassis through the mounting means and the power supply connector.

Figure 1:
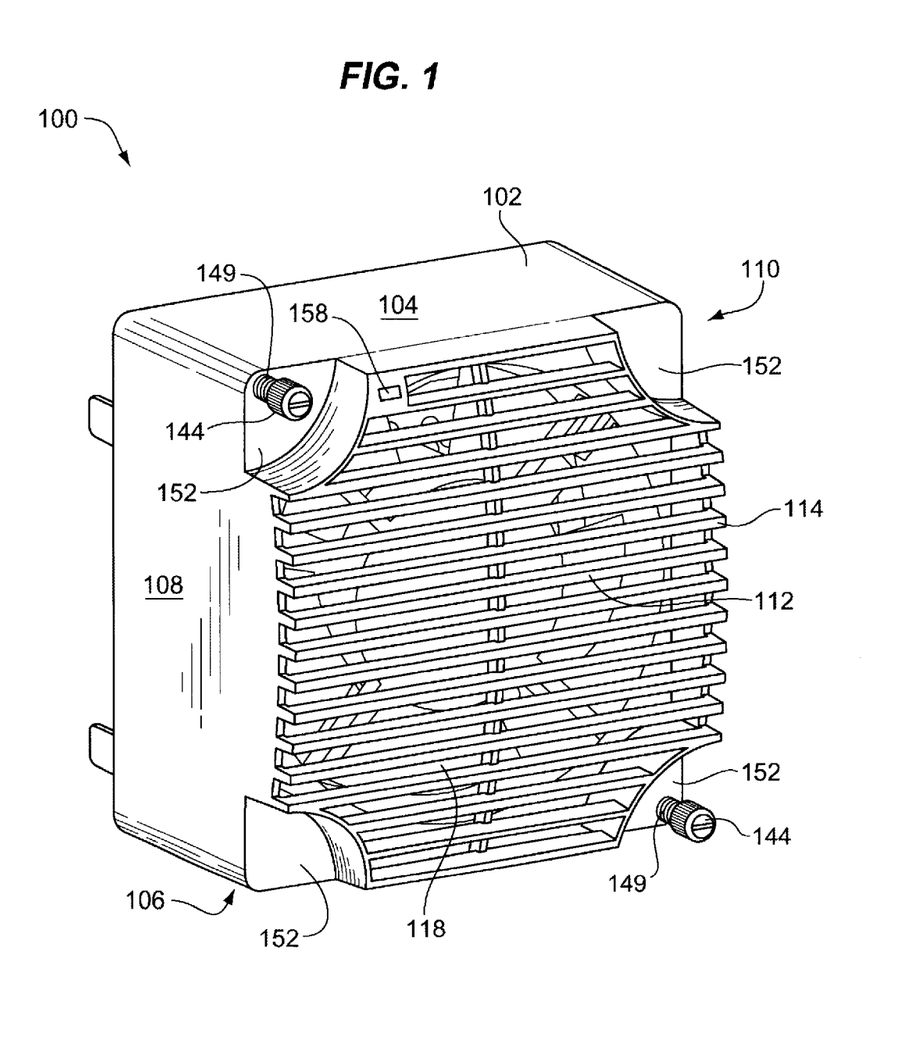
FIG. 1 depicts a frontal perspective of a fan unit of the apparatus in accordance with the invention.

Housing 102 includes structure for releasably mounting housing 102 to surface 210. Mounting rod openings 142 are provided in front wall 112 for accommodating mounting rods 144. Preferably, mounting rods 144 have thumb heads 145 to provide toolless tightening and removal of mounting rods 144. Similarly, fan assembly 120 contains mounting rod holes 146, and rear-wall finger guard 130 contains mounting rod notches 148. Mounting rod openings 142, mounting rod holes 146 and mounting rod notches 148 together form mounting rod passages through which mounting rods 144 are inserted and used to mount the apparatus 100 to a mounting surface of the system component. Preferably, mounting rods 144 are spring-loaded by springs 149 to effect convenient mounting and detachment of apparatus 100 to a mounting surface. FIG. 2A depicts a view of a spring-loaded thumb-head mounting rod 144 in accordance with the invention. Preferably, mounting rods 144 have threaded tips 151. Alternatively, mounting rods 144 may be conventional screws, preferably thumbscrews, for attaching apparatus 100 to a mounting surface. A mounting clip 153 clips around mounting rod 144 after it has been inserted through mounting rod opening 142. Mounting clip 153 includes a support tab 154 that rests on a support shelf 155 of housing 102, as depicted in FIG. 3. As shown in FIG. 1, outer surface 114 of front cover 112 preferably contains recesses 152 at the corners, thereby providing easy access to mounting rod heads 145, while keeping the top of rod heads 145 below or flush with outer surface 114 of front wall 112. The various features of mounting rod 144 as applied in apparatus 100 provide a structure and method for quickly and easily removing and replacing an apparatus 100 at a mounting surface.

Unit 100 further includes a light emitting diode ("LED"), which indicates operability status of unit 100. In FIG. 1, an LED window 158 is located at the top of front wall 112. Typically, an LED shows green for normal operational status, flashing yellow for imminent failure, and red for failure.

As shown in FIG. 3, the housing 102 encloses the fan assembly 120 and presents a convex front wall 112. Dashed lines 160, 162 indicate the locations of fan assembly walls 123, 124, and show offset distance $D_3$ between opening 103 and fan assembly 120. A front clearance zone 164 is provided between fan blades 123 and front cover 112.

With reference to FIGS. 2–3, it is noted that rear-wall finger guard 130 is located at the rear edge 166 of housing 102, closing opening 103. To avoid generation of noise by a "siren" effect, the housing further comprises a rear clearance zone 168 between the air intake side of a fan and a grate containing holes or other perforations. The minimum distance of rear clearance zone is a matter of design choice and will depend on air velocity and perforations size. For this reason, the distance in rear zone 168 between dashed line 162 and the rear-wall finger guard 130 at rear edge 166 is typically not less than 10 mm, and preferably is not less than 15 mm.

Housing 102, and fan assembly 120, and optionally rear-wall finger guard 130, include cooperative closures for assembly of fan assembly 120 and rear-wall finger guard 130 in housing 102. FIG. 3 shows insertion tabs 170 for inserting into mating tab receptacles in a mounting surface 102, which facilitates alignment during mounting of apparatus 100 onto a mounting surface.

Figure 4:
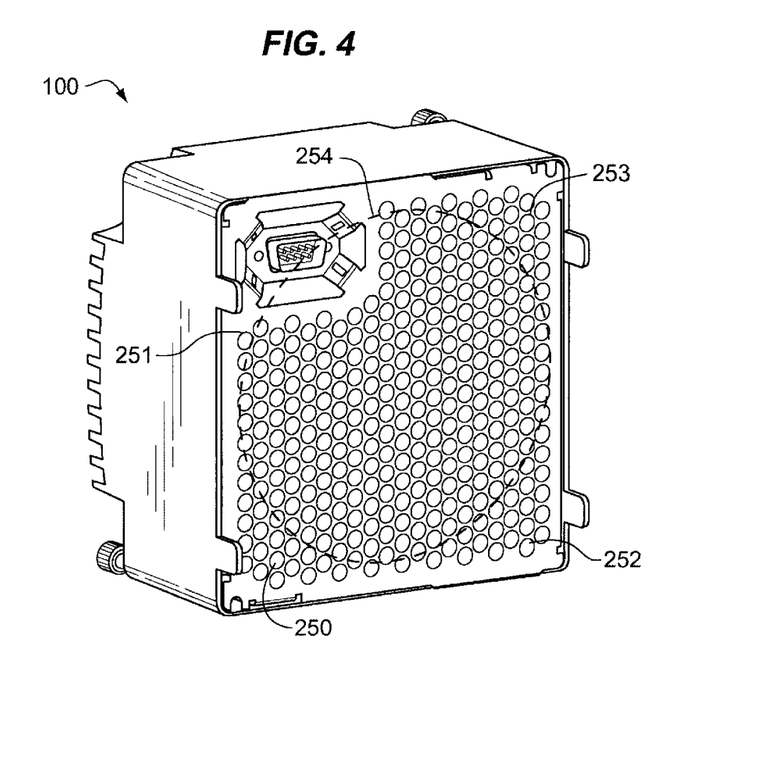
FIG. 4 depicts a rear perspective view of the fan unit in which the various components are assembled.

FIG. 4 depicts a rear perspective view of unit 100 similar to the view of FIG. 2, but in which the various components of units 100 are assembled. A unit 100 as depicted in FIG. 4 is an on-line modular unit, capable of on-line external mounting and replacement in a computer system.

Figure 5:
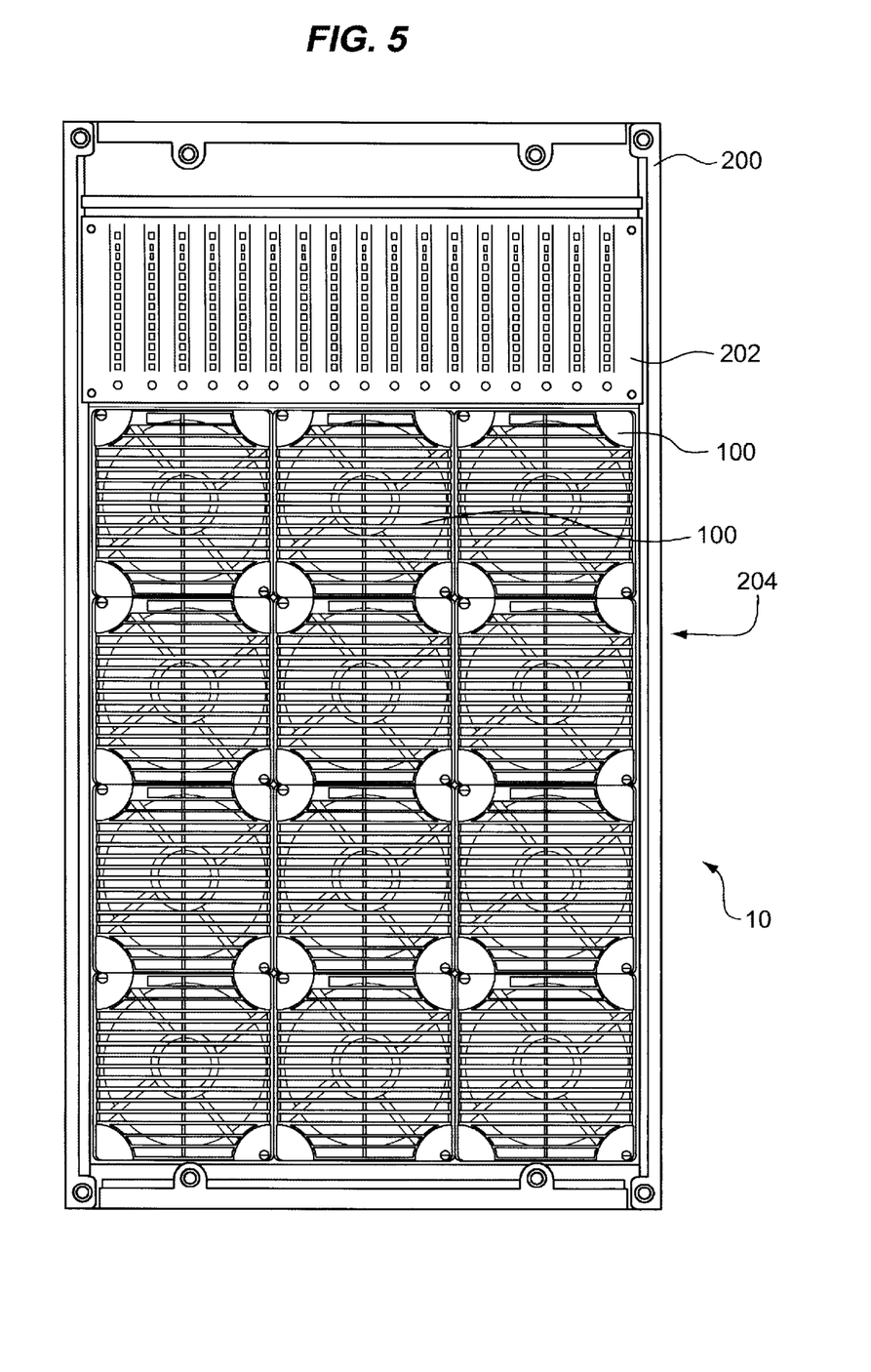
FIG. 5 shows the back of a network server on which an array of fan units in accordance with the invention have been mounted.

FIG. 5 shows the back external wall of a network server on which a plurality of units 100 in accordance with the invention have been mounted on a plurality of mounting surfaces 210. An advantage of an apparatus in accordance with the invention is that a plurality of such units are mountable on adjacent or neighboring mounting surfaces in a system, thereby providing system redundancy and efficient utilization of system surface area. As depicted in FIG. 5, each unit 100 is easily accessible, and is detachable simply by removing two mounting rods and pulling out the modular fan unit 100. In operation, a computer device such as network server 200 is connected within the system by numerous cables inserted in connectors of connector region 202. In the systems common in the prior art, the volume and the surface area in ventilation region 204 of network server 200 is not used. In contrast, in systems in accordance with the invention, units 100 are mounted directly onto the underlying machine chassis 206 of region 204.

Figure 6:
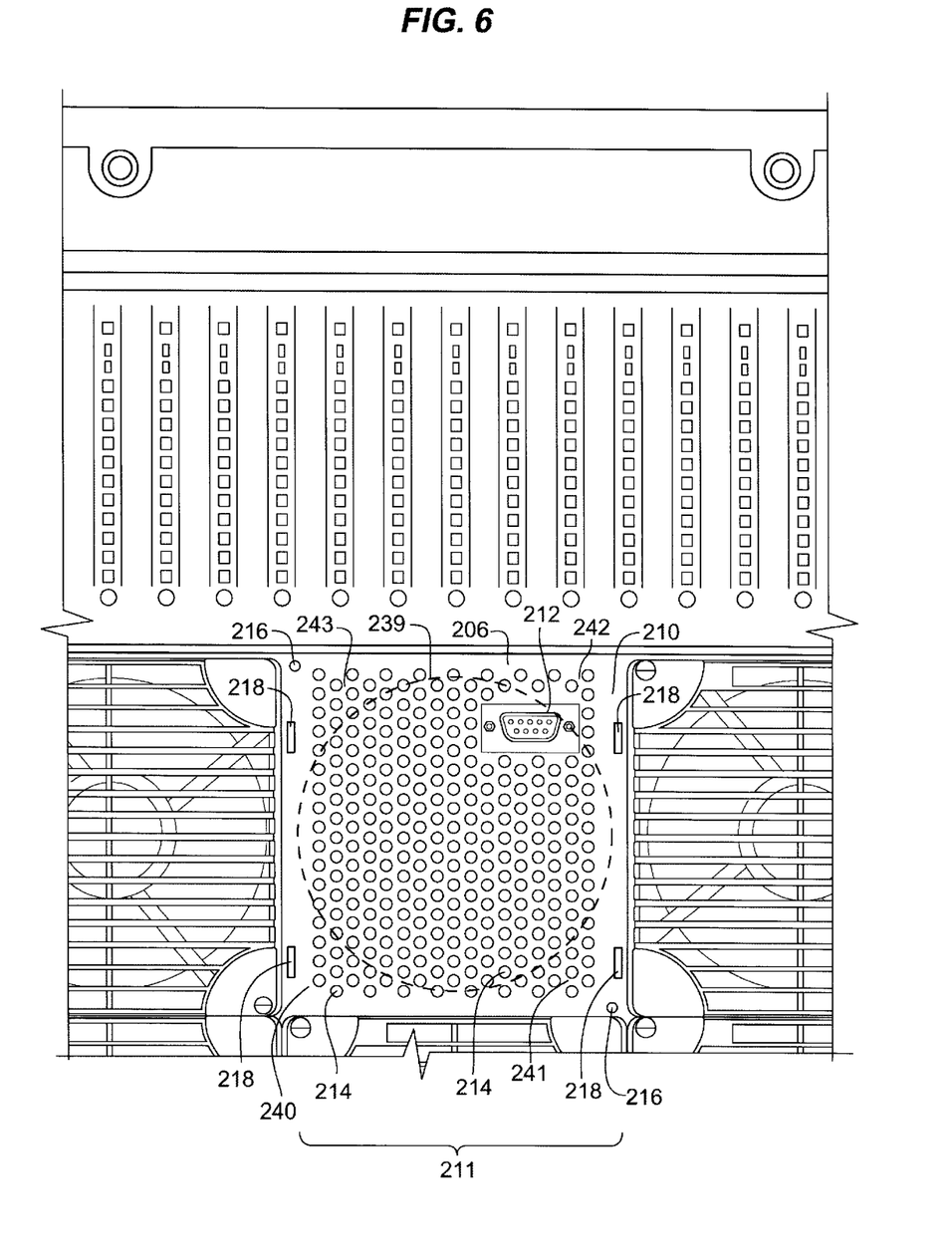
FIG. 6 shows a close-up view of a mounting surface of a machine chassis suitable for mounting a fan cooling system in accordance with the invention.

FIG. 6 shows a close-up view of mounting surface 210 of machine chassis 206. Mounting surface 210 is a part of conventional chassis 206 that has been modified for mounting of fan units 100 in accordance with the invention. Mounting surface 210 includes power supply connector 212, for mating with electrical connector 140 of unit 100 to connect electric fan 121 with a power supply.

Mounting surface 210 contains air apertures 214 through which air from the interior of a machine, such as network server 200, is drawn by fan 121 operating in exhaust mode. When housing 102 is attached to mounting surface 210, open face 103 of the housing 102 abuts the fan mounting surface 210 and encloses region 211 of the airflow apertures 214 in the fan mounting surface 210. Corner region portions of apertures 214 include regions that lie outside circular dashed line 239 which corresponds to the axial positioning of fan assembly cylindrical housing 126 when housing 102 is mounted mounting surface 210. Further, corner regions 240–243 are in axial alignment with said corner regions of said fan assembly 120, and are, for example, corner regions 240, 241, 242, and 243. Thus, fan assembly induced airflow between said fan assembly 120 and said corner aperture regions 240–243 is unrestricted by intervening structure such as a fan rack mounting structure found in patent '564) in the case where housing 102 omits use of guard 130. When a guard 130 is included in housing 102, guard corner regions 250–253 (shown in FIG. 4) defined by apertures lying outside circular dashed line 254 provide airflow to corresponding regions 240–243 on mounting surface 210. (Dashed line 254 corresponds to axial positioning of fan assembly cylindrical housing 126.) It will be appreciated that with or without guard 130, the airflow to corner aperture regions of mounting surface 210 will be improved when compared to conventional fan mounting assemblies such as those shown and described in the '564 and '819 patents.

Airflow openings 132 of rear-wall finger guard 130, described above with reference to FIG. 2, are patterned and sized to facilitate the desired airflow through air channels 214. Preferably, the dimensions of airflow perforations 132 are slightly larger than the dimensions of air channels 214 when an apparatus is used as an exhaust fan, drawing air out of a machine. For example, when air channels 214 have a circular diameter of 3 mm, then airflow perforations 132 have a circular diameter of about 3.5 mm.

Mounting surface 210 further includes threaded mounting rod receptacles 216 in which threaded tips 151 of mounting rods 144 are inserted and screwed. Mounting surface 210 of chassis 206 further includes tab receptacles 218 for receiving insertion tabs 170 of housing 102. Insertion tabs 170 facilitate proper alignment of apparatus 100 during mounting onto mounting surface 210, in particular, alignment of electrical connector 140 with power supply connector 212.

In a preferred embodiment in which a plurality of units 100 are utilized to provide cooling fan redundancy to a network server 200, housing 102 has a vertical height of about 13.3 cm and a width of about 12.7 cm. The depth of housing 102 from front to rear is about 8.9 cm. Electric fan 121 has a nominal diameter of 120 mm.

When an apparatus in accordance with the invention is utilized as a "push" fan in an alternative embodiment, the air intake side of the fan blades face the inner side 116 of front wall 112. As a result, the potentially hazardous air intake side of the blades is not exposed. Therefore, it is less important for an apparatus to include a rear-wall finger guard. To avoid noise generated by the "siren" effect, the distance between the front wall of the housing and the air intake side of the blades is not less than 10 mm, and is preferably not less than 15 mm.

To increase cooling of a machine, such as a network server 200 as depicted in FIG. 5, a plurality of cooling fan units in accordance with the invention are mounted to mounting surfaces located on a chassis at the front of the machine. These front-mounted fan units push air into the machine to increase cooling. When the unit does not include a rearwall finger guard, the electrical connector for connecting the fan to a power supply is typically integrated in a housing next to the grate in the front wall.

Figure 7:
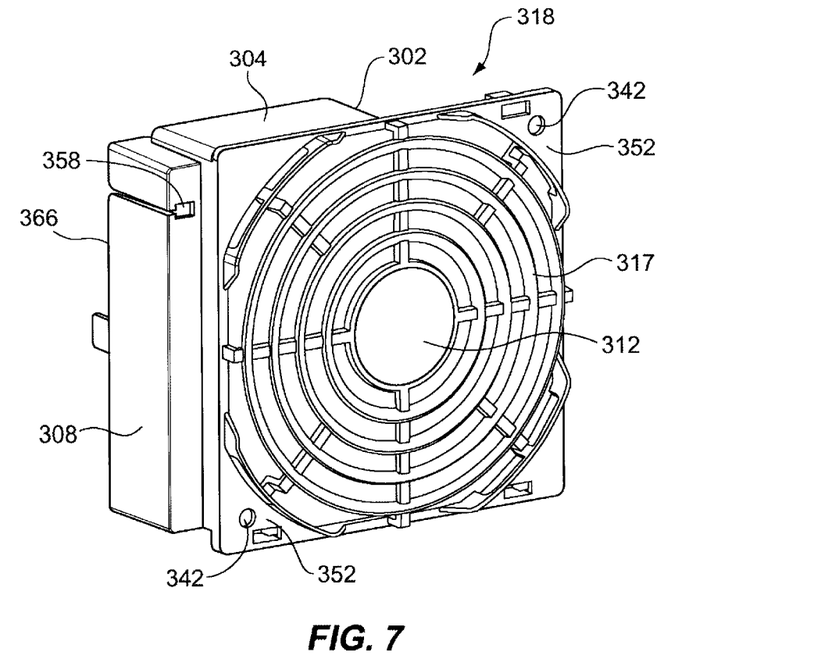
FIG. 7 shows a front perspective view of an alternative embodiment of a housing in accordance with the invention.
Figure 8:
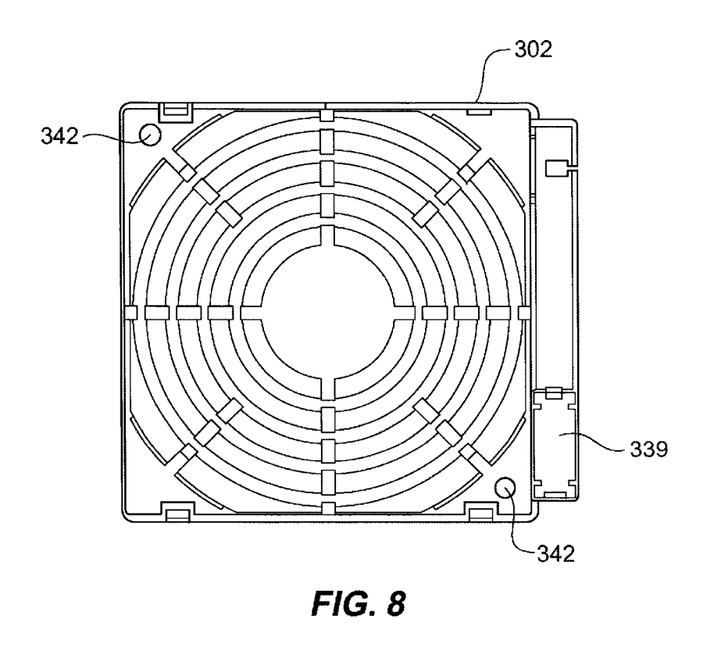
FIG. 8 shows a rear, elevated view of the alternative housing depicted in FIG. 7.

FIG. 7 shows a front perspective view of an alternative embodiment of a housing in accordance with the invention. A housing 302 includes a top 304, a first side 308, an outer front wall 312 having an outer side 114 and an inner side 116, a rear edge 366 and a rear airflow opening 318. Housing 302 does not include a second side, a bottom or a rear wall. Front wall 312 comprises a grate 317, corresponding to the diameter of a conventional propeller fan, similar to the fan described with reference to FIG. 2, above. The housing preferably comprises a plastic material, and is typically fabricated using a plastic injection molding process. Housing 302 comprises plastic clips or other attaching means for attaching housing 302 to a fan assembly. In use, a fan assembly, similar to fan assembly 120 described with reference to FIG. 2, is located in housing 302. Housing 302 includes an LED opening 357 at the side of grate 317 to accommodate an externally visible light emitting diode. As depicted in the rear, elevated view of housing 302 in FIG. 8, housing 302 includes a connector compartment 339 to the side of grate 317 for accommodating an electrical connector for connecting a fan in housing 302 with a power supply. As depicted in FIG. 7 and FIG. 8, housing 302 includes mounting rod openings 342 through which mounting rods are inserted for mounting an apparatus including housing 302 onto the front air-intake mounting surface of a machine. Front cover 312 contains recesses 352, thereby allowing easy access to mounting rod heads.

Another advantage of a unit in accordance with the invention, which contains only one fan assembly and which has a "footprint", or surface area, corresponding to a single fan diameter, is that a single malfunctioning fan is removable from a mounting surface of a machine without interrupting operation of other fan apparatuses on adjacent or neighboring mounting surfaces. Since the footprint of an apparatus is small, removal of 1 or 2 units out of a battery of units covering a mounting surface, as in FIG. 5, does not seriously adversely affect the cooling airflow through the machine.

Units in accordance with the invention are useful in a wide variety of circumstances and applications to effect cooling of machines. It is evident that those skilled in the art may now make numerous uses and modifications of the specific embodiments described, without departing from the inventive concepts. It is also evident that equivalent structures and processes may be substituted for the structures and processes described. Since certain changes may be made in the above embodiments without departing from the scope of the invention, it is intended that all subject matter contained in the above description or shown in the accompanying drawing be interpreted as illustrative and not in a limiting sense. Consequently, the invention is to be construed as embracing each and every novel feature and novel combination of features present in or inherently possessed by the apparatuses, systems and compositions described in the claims below and by their equivalents.

It should be understood that the embodiments described herein are exemplary and are not intended to limit the scope of the invention, which is defined in the claims below. Embodiments in accordance with the invention are described herein particularly with reference to computer systems and their cooling. Embodiments in accordance with the invention are useful for cooling many other types of electronic equipment, electrical instrumentation and machines. It is clear that an apparatus in accordance with the invention may be utilized to provide redundancy and on-line replaceability in various fields of application in which internally generated heat must be removed.

We claim:

1. An electrical component comprising,
    an exterior fan-mounting surface having airflow apertures and at least two electrical power supply connectors, and
    a cooling fan assembly having at least two fan units, each fan unit comprising a housing, an electric fan defining an outer diameter of fan blade rotation, a mount for selectively and releasably mounting the fan unit to the exterior fan-mounting surface, the mount being disposed on a region of said fan unit that is outside of the outer diameter of fan blade rotation, and an electrical connector releasably mateable with one of the at least two electrical power supply connectors of said exterior fan mounting surface, whereby one of said at least two fan units is individually removable from said exterior fan mounting surface without interrupting the operation of the other of said at least two fan units.

2. An electrical component apparatus as in claim 1, wherein each fan unit further includes a rear-wall guard positioned between the electric fan and the exterior fan mounting surface as the fan unit is mounted thereto, the rear wall guard having airflow apertures in axial alignment with, and of substantially equal dimensions as the airflow apertures of the exterior fan mounting surface.

3. An electrical component as in claim 1, wherein the mount comprises a plurality of mounting rods and a plurality of corresponding mounting rod passages formed through the housing of each fan unit and wherein the external fan mounting surface comprises a plurality of corresponding mount receptacles for receiving the plurality of mounting rods for mounting the fan unit onto the external fan mounting surface of the electrical component.

4. An electrical component as in claim 1, wherein the electrical connector of each fan unit comprises a filtered electrical connector.

5. An electrical component comprising;
    a planar externally facing fan mounting surface having a plurality of air flow apertures, a plurality of electrical power supply connectors connected in parallel and a plurality of fan unit receptacles defining an array of fan unit receiving sections, each fan unit receiving section having one electrical power supply connector and at least one fan unit receptacle,
    an array of fan units for mounting to the array of fan unit receiving sections, each fan unit having an electric fan including fan blades rotating in a path defining an outer path diameter, a box-shaped housing presenting a square-shaped open face and having spaced, opposed walls with openings to permit fan induced airflow through said housing, the housing presenting corner regions at a position outside of the outer path diameter of the fan blade path, and a mount for releasably fastening each fan unit to the fan unit receiving section of the fan mounting surface, whereby each fan unit of the array of fan units is individually removable from said fan mounting surface without interrupting the operation of the other fan units of said array of fan units.

* * * * *